(12) United States Patent
Chuang (10) Patent No.: US 8,266,568 B2
(45) Date of Patent: Sep. 11, 2012

(54) POWER MESH MANAGEMENT METHOD

(75) Inventor: Chia-Lin Chuang, Hsin Chu (TW)

(73) Assignee: Realtek Semiconductor Corp., Hsinchu (TW)

( * ) Notice: Subject to any disclaimer, the term of this patent is extended or adjusted under 35 U.S.C. 154(b) by 450 days.

(21) Appl. No.: 12/359,911

(22) Filed: Jan. 26, 2009

(65) Prior Publication Data

US 2009/0193271 A1 Jul. 30, 2009

(30) Foreign Application Priority Data

Jan. 30, 2008 (TW) ................................ 97103381 A (51) Int. Cl.
*G06F 17/50* (2006.01)
(52) U.S. Cl. ........................................................ 716/132
(58) Field of Classification Search .................. 716/109, 716/120, 133, 100, 132
See application file for complete search history.

(56) References Cited

U.S. PATENT DOCUMENTS

| | | | | |
|---|---|---|---|---|
| 5,095,352 A | * | 3/1992 | Noda et al. | 257/202 |
| 6,064,097 A | * | 5/2000 | Hiraga | 257/369 |
| 6,674,176 B2 | * | 1/2004 | Ratchkov | 257/784 |
| 6,925,627 B1 | * | 8/2005 | Longway et al. | 257/207 |
| 2003/0051910 A1 | * | 3/2003 | Dyke et al. | 174/262 |
| 2003/0155633 A1 | * | 8/2003 | Ratchkov | 257/666 |
| 2006/0226530 A1 | * | 10/2006 | Dinter et al. | 257/691 |
| 2008/0048331 A1 | * | 2/2008 | Chen | 257/773 |
| 2010/0237508 A1 | * | 9/2010 | Utsumi | 257/774 |
| 2012/0018839 A1 | * | 1/2012 | Tsuda | 257/500 |

FOREIGN PATENT DOCUMENTS

CN 1917206 A 2/2007

* cited by examiner

*Primary Examiner* — Suchin Parihar
(74) *Attorney, Agent, or Firm* — Thomas, Kayden, Horstemeyer & Risley, LLP (57) ABSTRACT

The invention discloses a power mesh managing method utilized in an integrated circuit. The integrated circuit includes a standard cell and a standard-cell power supplying mesh corresponding to a first direction. The power mesh managing method includes: defining a power supplying network including a first plurality of power meshes growing along the first direction and a second plurality of power meshes growing along a second direction, and defining an assistant connecting network on a third metal layer, wherein the assistant connecting network includes a plurality of assistant connecting lines growing along the second direction, the first plurality of power meshes are formed on a first metal layer, the second plurality of power meshes on a second metal layer, the third metal layer is below the first metal layer, and the second metal layer is above the first metal layer.

16 Claims, 6 Drawing Sheets

POWER MESH MANAGEMENT METHOD

BACKGROUND OF THE INVENTION (a) Field of the Invention

The invention relates to a power mesh managing method and related integrated circuit, particularly to a method for managing power mesh of a standard cell and related integrated circuit.

(b) Description of the Related Art

As the APR (automatic placement and routing) tool not only helps a circuit designer placing circuit elements at the suitable locations in the chip easily but also helps the circuit designer managing the power routing, the APR tool has become one of the indispensable tools for the circuit designer.

Generally, the APR tool uses two types of blocks to manage circuit elements. One of them is the standard cell. As the name implies, the standard cell is a type of standardized block having specific size and built-in power managing method for managing some often-used standard circuit elements, such as: flip-flops, logic gates, and the like. Then, the APR tool can neatly arrange a plurality of standard cells in the area of a chip. The other one is the macro block. The macro block is different from the standard cell. The macro block does not have fixed size and is used to manage the circuits having specific functions designed by the circuit designer, such as: SRAM, ADC, and so on.

However, the APR tool follows specific routing rules to appropriately arrange the macro block and the standard cell at the suitable locations of the chip and to draw the power network. But, as the APR tool can only perform regular management, the details of the management still needs manual adjustments by the designer. Therefore, the APR tool still needs to be improved.

Figure 1:
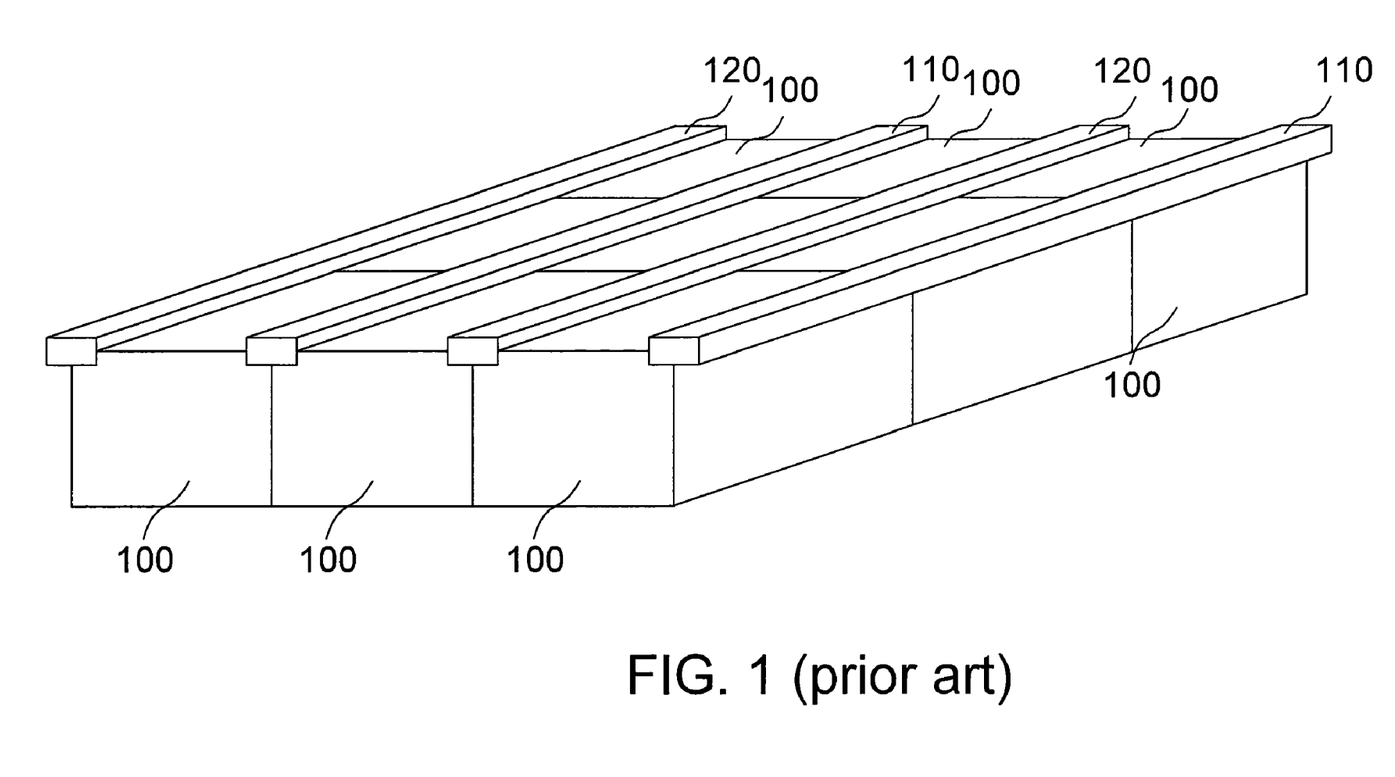
FIG. 1 shows a three-dimensional schematic diagram illustrating the standard cell and the standard cell power supplying meshes managed by the APR tool according to the prior art.

Now please refer to FIG. 1 which shows a three-dimensional schematic diagram illustrating the standard cell 100 and the standard cell power supplying meshes 110, 120 managed by the APR tool according to the prior art. In general, as shown in FIG. 1, the standard cell power supplying meshes 110, 120 growing along the horizontal direction are placed along each side of the standard cell 100 according to the managing rule of the traditional APR tool. The power supplying mesh 110 conducts the external power $V_{DD}$ to the standard cell 100 while the power supplying mesh 120 conducts the ground power $V_{SS}$ to the standard cell 100.

Figure 2:
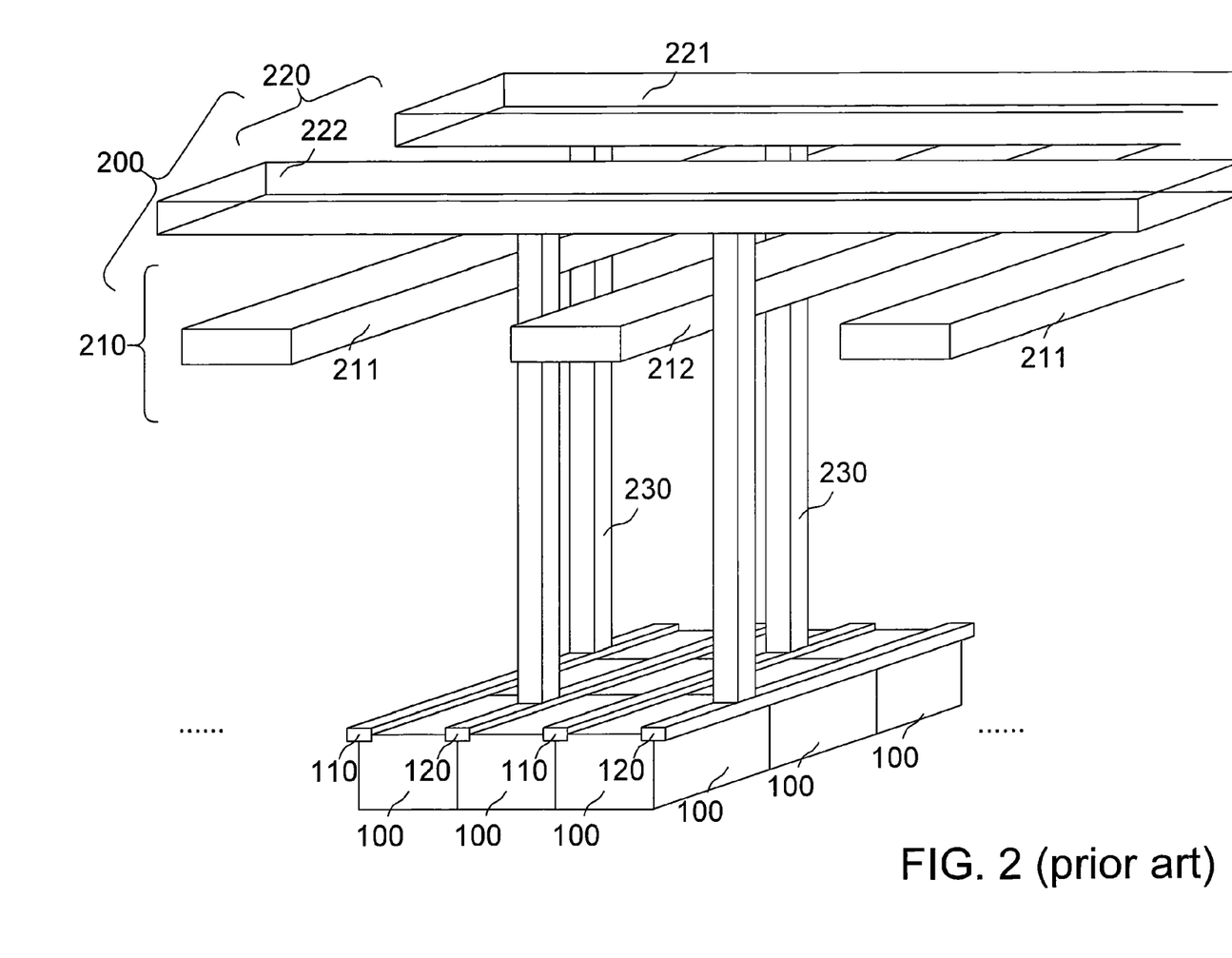
FIG. 2 shows a three-dimensional schematic diagram illustrating the standard cell, the standard-cell power supplying meshes, and the power supplying mesh located in the layer above the standard cell in FIG. 1.

Then, please refer to FIG. 2 which shows a three-dimensional schematic diagram illustrating the standard cell 100, the standard-cell power supplying meshes 110, 120, shown in FIG. 1, and the power supplying network 200 located above the standard cell 100. Please note that, for clarity, only three rows of standard cell 100 are shown in FIG. 2. But, in practical applications, there can be many more standard cells 100 in the chip. As shown in FIG. 2, the lower part is the standard cell and the standard cell power supplying meshes 110, 120 in FIG. 1 while the upper part is the power supplying network 200 managed by the APR tool according to the prior art. As shown in FIG. 2, the power supplying network 200 includes the horizontal power supplying mesh 210 and the vertical power supplying mesh 220. The vertical power supplying mesh 220 and the horizontal power supplying mesh 210 are located in different metal layers. The vertical power supplying mesh 220 is positioned on the layer above the horizontal power supplying mesh 210. The horizontal power supplying mesh 210 is perpendicular to the vertical power supplying mesh 220 to form a matrix. Besides, the horizontal power supplying mesh 210 includes a plurality of mutually interlaced power lines 211 and ground lines 212. The vertical power supplying mesh 220 also includes a plurality of mutually interlaced power lines 221 and ground lines 222.

Besides, the power lines 211, 221 must couple to the external power (not shown in the figure). The power lines 211, 221 couple to the above mentioned standard-cell power supplying mesh 110 through the via hole ("via") and the via plug 230 for conducting the voltage $V_{DD}$ that is provided by the external power into the standard cell 100. On the other hand, the ground lines 212, 222 also must couple to the ground voltage $V_{SS}$. And, the ground lines 212, 222 couple to the standard-cell power supplying mesh 120 through the via and the via plug 230 for conducting the ground voltage into the standard cell 100. Please note that, for clarity, the via 230 between the horizontal power supplying mesh 210 and the standard cell power supplying meshes 110, 120 is not shown in FIG. 2. In general, the interlacing power lines, that are at the equal potential, of the horizontal power supplying mesh 210 and the vertical power supplying mesh 220 (such as: between 211 and 221 and between 221 and 222) couple to each other at the overlapping area through the via and the via plug. The via and the via plug to couple the power supplying meshes at the overlapping area are also not shown in FIG. 2, for clarity.

Please also note that, in order to conduct the external power $V_{DD}$/ground voltage $V_{SS}$ into the standard cell 100, the resistance between the external power and the standard cell 100 is generally properly designed to obtain better overall circuit performance. The resistance between the external power and the standard cell 100 is directly related to the number of the vias and the via plugs. As is well known to the industry, due to the resistance shunting effect, the more is the number of the vias/via plugs the more is the reduction of the resistance between the external power and the standard cell 100. Hence, the positions that can be allocated to the vias/via plugs become crucial. As mentioned before, the adjustable range of the resistance becomes larger as there are more allocable positions for the vias/via plugs. Therefore, in general, the routing rules of the APR tool are usually designed to place the vias and the via plugs, at the overlapping areas between the power supplying meshes 210/220 and the standard cell power meshes 110/120 and at the overlapping areas between the power supplying mesh 210 and the power supplying mesh 220 for coupling. However, such a design will cause some problems.

Figure 3:
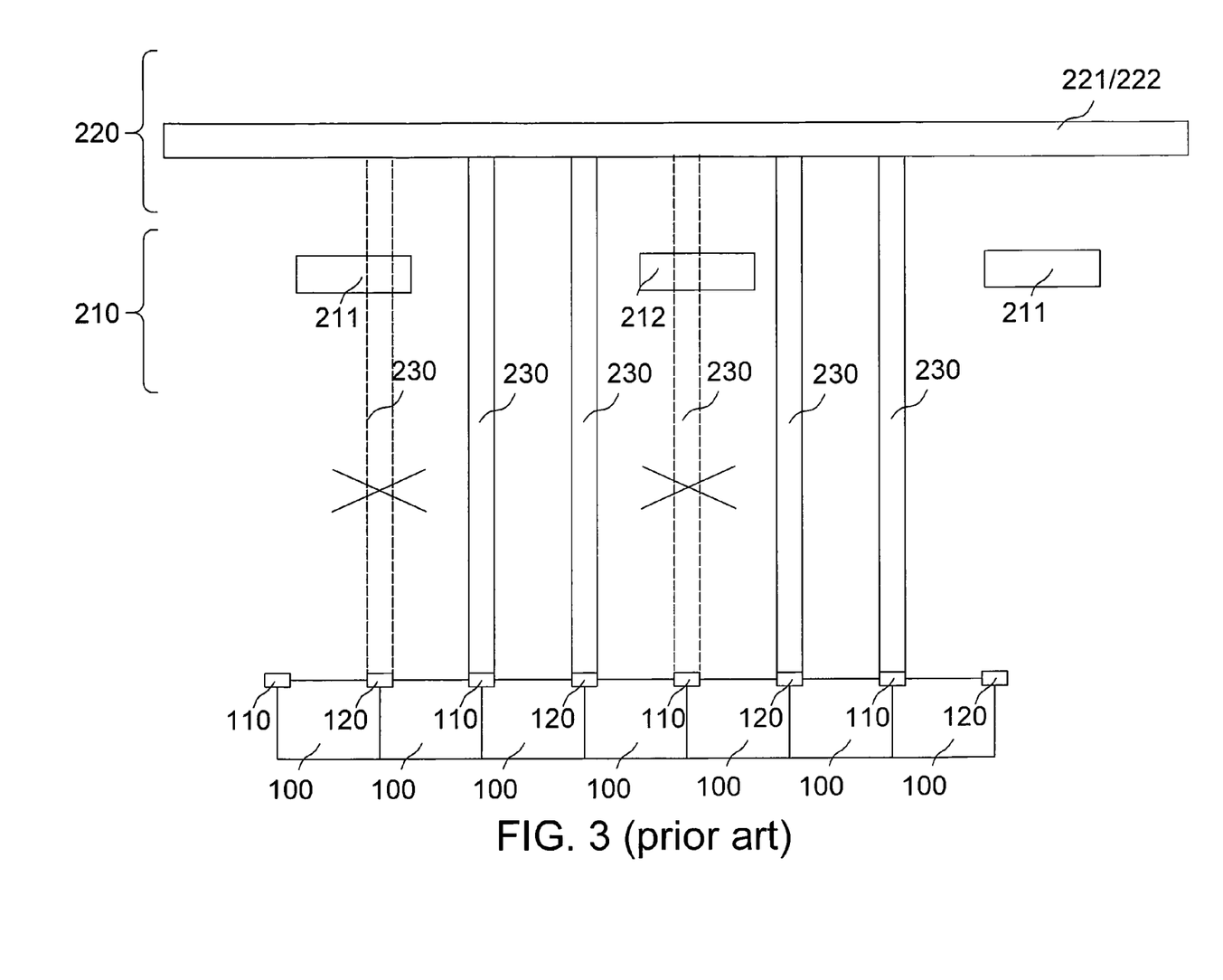
FIG. 3 shows a schematic diagram illustrating a side view of FIG. 2.

Now, please refer to FIG. 3 which shows a schematic diagram illustrating the side view of the standard cell power meshes 110, 120 and the standard-cell power supplying network 200 located in the upper layer. As shown in FIG. 3, since the horizontal power supplying mesh 210 is located in the layer below the vertical power supplying mesh 220, the horizontal power supplying mesh 210 can be coupled to the standard-cell power supplying meshes 110/120 by way of the via/via plug 230 without obstruction. Therefore, the above mentioned routing mechanism will not face too many problems. But, for the vertical power supplying mesh 220, since the vertical power supplying mesh 220 may be blocked by the horizontal power supplying mesh 210 that may be positioned between the power supplying mesh 220 located in the upper layer and the standard-cell power supplying meshes 110, 120, the power supplying mesh 220 located in the upper layer may not be able to couple to the standard-cell power supplying meshes 110, 120 below by way of the vias/via plugs. Therefore, the positions for placing the vias/via plugs become limited. As shown in FIG. 3, the via/via plug 230 that is marked by "X" indicates that the via/via plug cannot be placed at that location. That is, the via/via plug 230, that is supposed to couple the vertical power lines 221/222 in the upper layer to the standard cell power meshes 110/120 in the lower layer, is blocked by the horizontal power supplying mesh 210 and cannot be provided.

Besides, the above mentioned structure has another problem. In addition to the drawback that the horizontal power supplying mesh 210 blocks the connecting route between the vertical power supplying mesh 220 and the power supplying meshes 110/120 below. The position and the width for the horizontal power supplying mesh 210 suffer a lot of limitations to complete the above mentioned coupling mechanism. For example, if the horizontal power supplying mesh 210 is too wide and is not positioned suitably, the standard-cell power supplying meshes 110, 120 of different electrical properties can be shadowed simultaneously. Then, the standard-cell power supplying meshes 110, 120 cannot directly acquire the voltage $V_{DD}$ and the ground voltage $V_{SS}$ simultaneously through the horizontal power supplying mesh 210 or the vertical power supplying mesh 220 above. As above mentioned, the position and the width for the horizontal power supplying mesh 210 must be properly designed to avoid the above mentioned problems. However, such an approach reduces the flexibility of the routing and the routing design becomes much more complicated.

Therefore, those who are skilled in the art must develop new routing rules and layout methods to solve the above mentioned problems.

BRIEF SUMMARY OF THE INVENTION

Therefore, one object of the invention is to provide a routing rule of the APR tool and the related integrated circuit layout method for managing a new type of standard-cell power supplying mesh and solving the problems in the prior art.

A power mesh managing method applicable in an integrated circuit is provided. The integrated circuit comprises at least a standard cell and a standard-cell power supplying mesh of the standard cell. The standard-cell power supplying mesh corresponding to a first direction couples to the standard cell. The power mesh managing method comprises defining a power supplying network and defining an assistant connecting network on a third metal layer. The power supplying network includes a plurality of first power supplying meshes growing along the first direction and a plurality of second power supplying meshes growing along a second direction. The first power supplying meshes are on a first metal layer and the second power supplying meshes are on a second metal layer. The assistant connecting network includes a plurality of assistant connecting lines growing along the second direction. The second metal layer is above the first metal layer and the third metal layer is below the first metal layer.

An integrated circuit comprises a standard cell, a standard-cell power supplying mesh, a power supplying network, and an assistant connecting network. The standard-cell power supplying mesh corresponding to a first direction couples to the standard cell. The power supplying network includes a plurality of first power supplying meshes corresponding to the first direction and a plurality of second power supplying meshes corresponding to a second direction. The assistant connecting network is formed on a third metal layer. The first power supplying meshes are formed on a first metal layer and the second power supplying meshes are formed on a second metal layer. The assistant connecting network includes a plurality of assistant connecting lines corresponding to the second direction. The second metal layer is above the first metal layer and the third metal layer is below the first metal layer.

A better circuit routing method can be managed according to the invention and the method can be implemented in the APR tool to design a better circuit layout that avoids blocking the vias/via plugs by the power supplying mesh below and eliminates the limitations of the position and the width for the horizontal power supplying mesh. Not only the routing design flexibility is improved but also the routing design can be done by following the well-defined rules.

DETAILED DESCRIPTION OF THE INVENTION

Figure 4:
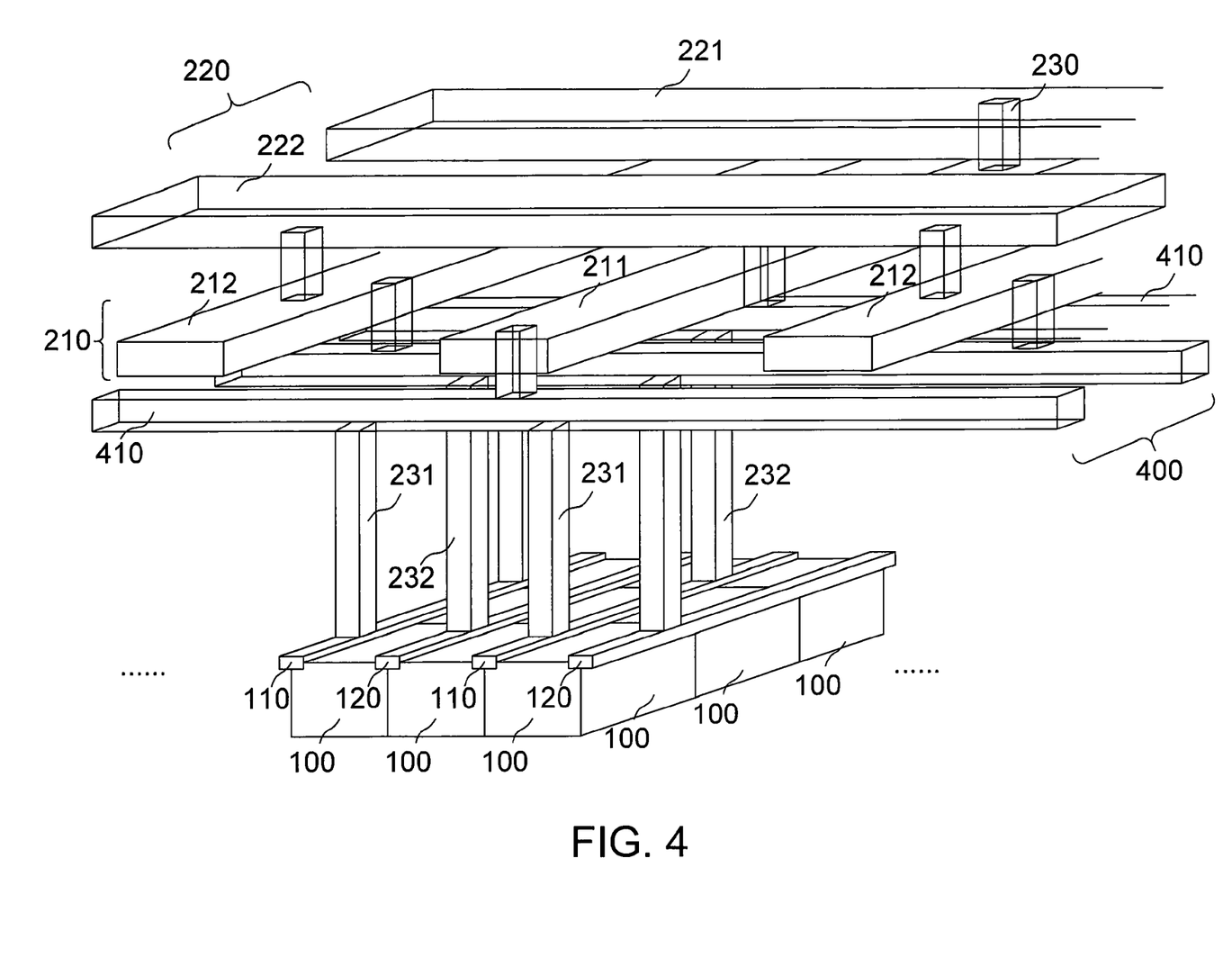
FIG. 4 shows a schematic diagram illustrating the power supplying network and the assistant connecting network located in the layer above the standard cell according to one embodiment of the invention.

Now, please refer to FIG. 4 which shows a schematic diagram illustrating the power supplying network 200 and the assistant connecting network 400 located in the layer above the standard cell 100 according to one embodiment of the invention. The structure and the functionalities of the standard cell 100 and the standard-cell power supplying meshes 110, 120 in FIG. 4 are the same as those of the standard cell 100 and the standard-cell power supplying meshes 110, 120 in FIG. 1. Please note that only three rows of standard cell 100 are shown in FIG. 4, for clarity. However, there can be more standard cells 100 in the actual chip.

Please note that an assistant connecting network 400 is also located, together with the power supplying network 200, in the layer above the standard cell 100 according to one embodiment of the invention. Similarly, the power supplying network 200 is the same as the power supplying network 200 in FIG. 2 and includes the horizontal power supplying mesh 210 and the vertical power supplying mesh 220. The vias/via plugs 231/232 couple the horizontal power supplying mesh 210 and the vertical power supplying mesh 220. In order to clearly mark the electrical property, as shown in FIG. 4, the via/via plug 231 is used to couple various power lines (that is, the voltage corresponds to the $V_{DD}$). The via/via plug 232 is used to couple various ground lines (that is, the voltage corresponds to the $V_{SS}$).

As mentioned before, if there is only the power supplying network 200 located in the layer above the standard cell 100, the horizontal power supplying mesh 210 may block the electrical coupling between the vertical power supplying mesh 220 and the standard-cell power supplying meshes 110, 120 (that is, limiting the via positions between the vertical power supplying mesh 220 and the standard-cell power supplying meshes 110, 120). Positioning the horizontal power supplying mesh 210 is also limited. Therefore, besides the power supplying network 200, a layer of assistant connecting network 400 is set up between the power supplying network 200 and the standard-cell power supplying meshes 110, 120 to assist the electrical coupling between the power supplying network 200 and the standard-cell power supplying meshes 110, 120 according to one embodiment of the invention. According to one embodiment of the invention, the assistant connecting network 400 couples to the horizontal power supplying mesh 210 through the vias/via plugs 231/232. The assistant connecting network 400 includes a plurality of assistant connecting lines 410 growing vertically like the vertical power supplying mesh 220.

Thus, the horizontal power supplying mesh 210 can be successfully coupled to the standard-cell power supplying meshes 110/120 below by way of the assistant connecting lines 410 of the assistant connecting network 400. As shown in FIG. 4, the assistant connecting lines 410 couple to the standard-cell power supplying meshes 110/120 by way of the vias/via plugs 231/232, separately, according to one embodiment of the invention. Since the assistant connecting line 410 growing vertically like the vertical power supplying mesh 220 is vertical to the standard-cell power supplying meshes 110/120 growing horizontally and nothing is in between to block each other, the assistant connecting line 410 couples to the standard-cell power supplying meshes 110/120 by the via/via plug 231/232 smoothly. The assistant connecting line 410 also couples to the horizontal power supplying mesh 210 by the via/via plug 231/232. Therefore, the horizontal power supplying mesh 210 couples to the standard-cell power supplying meshes 110/120 for conducting the external power into the standard cell 100.

Since the horizontal power supplying mesh 210 couples to the vertical power supplying mesh 220 and even if the assistant connecting line 410 does not couple to the vertical power supplying mesh 220 directly, the vertical power supplying mesh 220 still couples to the standard-cell power supplying meshes 110/120 below through the horizontal power supplying mesh 210 and the assistant connecting line 410.

Or, the assistant connecting line 410 can be coupled to the vertical power supplying mesh 220 by the via/via plug 231/232 according to another embodiment of the invention (not shown in the figure). Then, the vertical power supplying mesh 220 couples to the standard-cell power supplying meshes 110/120 directly by way of the assistant connecting line 410.

Figure 5:
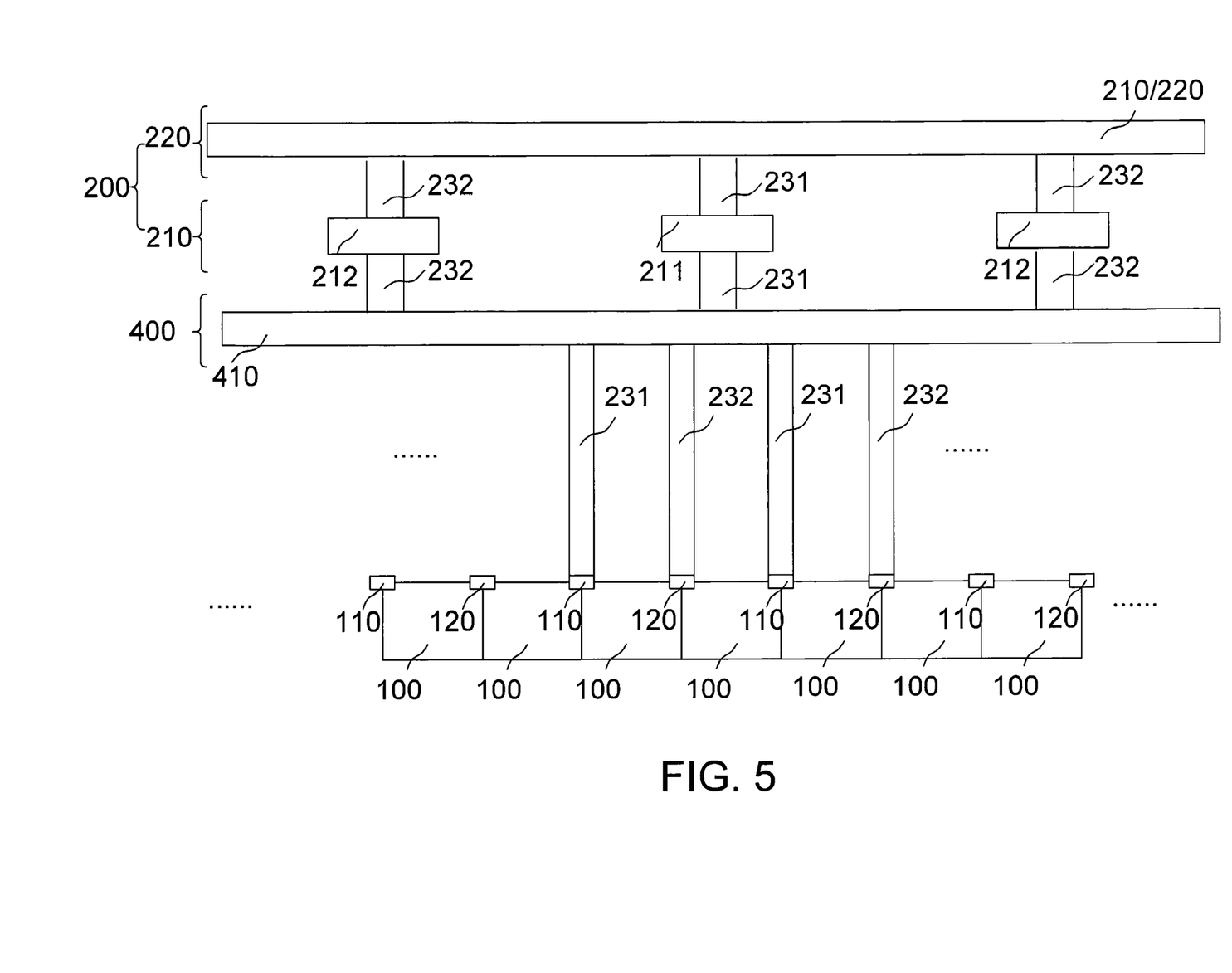
FIG. 5 shows a schematic diagram illustrating a side view of FIG. 4.

Now, please refer to FIG. 5 which shows a schematic diagram illustrating a side view of FIG. 4. It is clearly shown in FIG. 5 that the vertical power supplying mesh 220 couples to the standard-cell power supplying meshes 110/120 below through the horizontal power supplying mesh 210 and the assistant connecting line 410 by way of the vias/via plugs 231/232.

Furthermore, it should be noted that the above mentioned structure can be implemented easily by those who are skilled in the art. Since there are usually more than three metal layers above the standard cell 100 in the advanced process, those who are skilled in the art can select any three metal layers to implement the above mentioned power supplying network 200 and the above mentioned assistant connecting network 400 according to different requirements. For example, as the standard-cell power supplying meshes 110, 120 are usually located at the metal layer M1, those who are skilled in the art can choose the metal layers M4, M5, M6 to implement the power supplying network 200 and the above mentioned assistant connecting network 400.

Please note that, in order to reduce the routing resource used by the newly introduced assistant connecting network 400, the width for the assistant connecting line 410 is substantially equal to the width of a via plug according to one embodiment of the invention. Thus, such a design releases the space of the lower metal layers. As the space of the lower metal layers is more precious, the released space can be used for routing and coupling in the other portion of the circuit. Therefore, the benefit of implementing the assistant connecting line 410 with less width in the lower metal layers (such as the above mentioned metal layer M4) is to release more space of the lower metal layers.

Since both of the horizontal power supplying mesh 210 and the vertical power supplying mesh 220 couple to the standard-cell power supplying meshes 110, 120 below by way of the assistant connecting network 400, the position and the width for the horizontal power supplying mesh 210 do not suffer the same limitation mentioned before. For example, the horizontal power supplying mesh 210 couples to the standard-cell power supplying meshes 110, 120 by way of the assistant connecting network 400. Then, even if the width for the horizontal power supplying mesh 210 is larger to shadow the standard-cell power supplying meshes 110, 120 below, such mechanism will not influence the electrical properties of the standard-cell power supplying meshes 110, 120 (that is, the standard-cell power supplying meshes 110, 120 can acquire the voltage $V_{DD}$ and the ground potential $V_{SS}$ from the assistant connecting network 400 above directly through the via).

Figure 6:
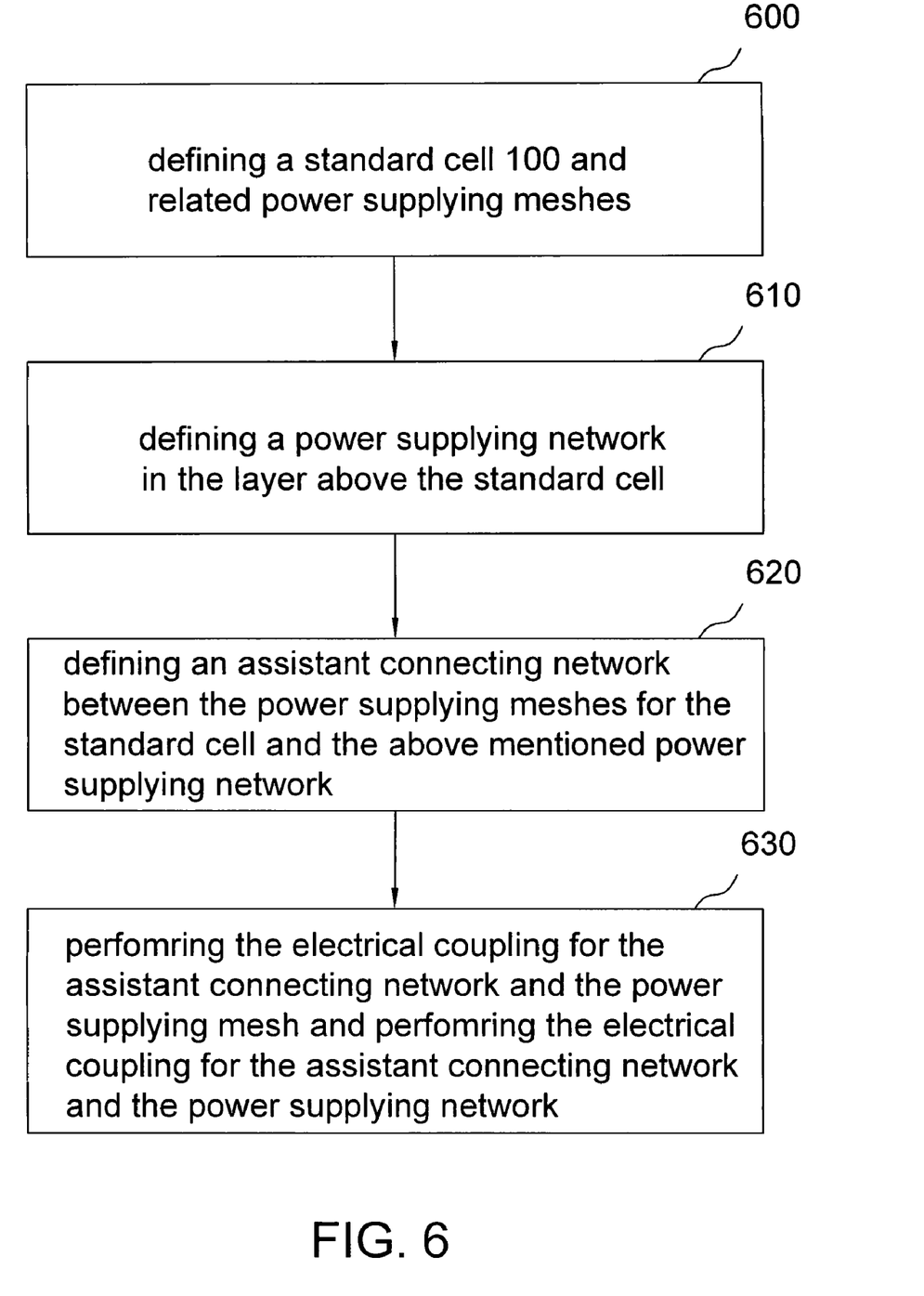
FIG. 6 shows the flow chart of the steps executed by the APR tool according to one embodiment of the invention.

Those who are skilled in the art should be able to implement the descriptions up to now in the APR tool to set up a new routing rule. Please refer to FIG. 6 which shows the flow chart of the managing method executed by the APR tool according to one embodiment of the invention. The method comprises the following steps:

Step 600: defining a standard cell 100 and related power supplying meshes 110, 120;

Step 610: defining a power supplying network in the layer above the standard cell 100 where the power supplying network includes a plurality of power supplying mesh structure 210 growing along the vertical direction and a plurality of power supplying mesh structure 220 growing along the horizontal direction and the power supplying mesh structure 210 and the power supplying mesh structure 220 are placed on different metal layers;

Step 620: defining an assistant connecting network 400 between the power supplying meshes 110, 120 of the standard cell 100 and the above mentioned power supplying network, where the assistant connecting network 400 includes a plurality of connecting lines 410 growing along the horizontal direction;

Step 630: performing the electrical coupling for the assistant connecting network and the power supplying mesh and performing the electrical coupling for the assistant connecting network and the power supplying network. The coupling step is to form the vias and the via plugs in the vertically intersected overlapping areas of the power supplying network and the assistant connecting network, and in the vertically intersected overlapping areas of the assistant connecting network and the power supplying network.

First of all, a common standard cell, the standard-cell power supplying mesh (Step 610), and the power supplying network (Step 620) are drawn according to the prior art. Then, the assistant connecting network disclosed before is drawn between the power supplying network and the standard-cell power supplying mesh (Step 630). Lastly, the standard-cell power supplying mesh, the power supplying network, and the assistant connecting network are coupled by way of the vias (Step 640). Those who are skilled in the art should be able to understand the description up to now. Thus, the details of the program codes of the APR tool will not be repeated hereinafter.

Please note that, as one additional metal layer is used to manage the assistant connecting network according to one embodiment of the invention, the assistant connecting network is only implemented above the standard cell. The assistant connecting network is not arranged above the more complicated macro block. However, such an example is only one embodiment of the invention and should not be construed as any limitation on the implementation of the invention.

Compared to the prior art, a better circuit routing method can be managed according to the invention. The method can be implemented in the APR tool to design a better circuit layout that avoids blocking the vias by the power supplying mesh below. The limitations of the position and the width for the horizontal power supplying mesh can be eliminated. Not only the flexibility of the routing design is improved but also the routing design can be done by following the well-defined rules.

Although the description of the invention is by way of above-mentioned examples of embodiments, however, it should not be construed as any limitation on the scope of the invention. Various modifications or changes can be performed by those who are skilled in the art without deviating from the scope of the invention.

What is claimed is:

1. A power mesh managing method, implemented by an automatic placement and routing tool, applicable in an integrated circuit, that comprises at least one standard cell and a standard-cell power supplying mesh of the standard cell where the standard-cell power supplying mesh corresponding to a first direction couples to the standard cell, the power mesh managing method comprising:
    defining a power supplying network including a plurality of first power supplying meshes growing along the first direction and a plurality of second power meshes growing along a second direction wherein the plurality of first power supplying meshes are formed on a first metal layer and the plurality of second power supplying meshes are on a second metal layer; and
    defining an assistant connecting network on a third metal layer, wherein the assistant connecting network includes a plurality of assistant connecting lines growing along the second direction and, wherein the plurality of assistant connecting lines are directly connected to the second metal layer by via holes, and wherein the width of each assistant connecting line of the assistant connecting network is smaller than the width of each mesh line of the power supplying network;
    wherein the second metal layer is above the first metal layer and the third metal layer is below the first metal layer.

2. The power mesh managing method according to claim 1, further comprising:
    coupling the power supplying network to an external power and the standard-cell power mesh for inputting the external power to the standard cell through the power supplying network and the standard-cell power supplying mesh.

3. The power mesh managing method according to claim 2, further comprising:
    coupling the plurality of assistant connecting lines to the standard-cell power supplying mesh and the power supplying network.

4. The power mesh managing method according to claim 3, wherein the step of coupling the plurality of assistant connecting lines to the power supplying network comprises:
    coupling the plurality of assistant connecting lines to the plurality of first power supplying meshes.

5. The power mesh managing method according to claim 3, wherein the step of coupling the plurality of assistant connecting lines to the power supplying network comprises:
    coupling the plurality of assistant connecting lines to the plurality of second power supplying meshes.

6. The power mesh managing method according to claim 2, wherein the step of coupling the plurality of assistant connecting lines to the standard-cell power supplying mesh comprises:
    coupling the plurality of assistant connecting lines to the standard-cell power supplying mesh by via holes.

7. The power mesh managing method according to claim 6, wherein the width of each assistant connecting line for the plurality of assistant connecting lines is substantially equal to the width of the via hole.

8. The power mesh managing method according to claim 1, further comprising:
    coupling the plurality of first power supplying meshes to the plurality of second power supplying meshes.

9. An integrated circuit, comprising:
    a standard cell;
    a standard-cell power supplying mesh corresponding to a first direction coupling to the standard cell;
    a power supplying network including a plurality of first power supplying meshes corresponding to the first direction and a plurality of second power supplying meshes corresponding to a second direction, wherein the plurality of first power supplying meshes are formed on a first metal layer and the plurality of second power supplying meshes are on a second metal layer; and
    an assistant connecting network formed on a third metal layer, wherein the assistant connecting network includes a plurality of assistant connecting lines corresponding to the second direction and, wherein the plurality of assistant connecting lines are directly connected to the second metal layer by via holes, and wherein the width of each assistant connecting line of the assistant connecting network is smaller than the width of each mesh line of the power supplying network;
    wherein the second metal layer is above the first metal layer and the third metal layer is below the first metal layer.

10. The integrated circuit according to claim 9, wherein the power supplying network couples to an external power and the standard-cell power supplying mesh for inputting the external power to the standard cell through the power supplying network and the standard-cell power supplying mesh.

11. The integrated circuit according to claim 10, wherein the plurality of assistant connecting lines couple to the standard-cell power supplying mesh and the power supplying network.

12. The integrated circuit according to claim 11, wherein the plurality of assistant connecting lines couple to the plurality of second power supplying meshes.

13. The integrated circuit according to claim 11, wherein the plurality of assistant connecting lines couple to the plurality of first power supplying meshes.

14. The integrated circuit according to claim 11, wherein the plurality of assistant connecting lines couple to the standard-cell power supplying mesh by via holes.

15. The integrated circuit according to claim 14, wherein the width of each assistant connecting line for the plurality of assistant connecting lines is substantially equal to the width of the via hole.

16. The integrated circuit according to claim 9, wherein the plurality of first power supplying meshes couple to the plurality of second power supplying meshes.

* * * * *